(12) United States Patent
Kaga et al.

(10) Patent No.: US 10,871,718 B2
(45) Date of Patent: Dec. 22, 2020

(54) EXPOSURE APPARATUS, METHOD FOR CONTROLLING THE SAME AND ARTICLE MANUFACTURING METHOD

(71) Applicant: CANON KABUSHIKI KAISHA, Tokyo (JP)

(72) Inventors: Akihisa Kaga, Utsunomiya (JP); Kazushi Mizumoto, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/725,593

(22) Filed: Dec. 23, 2019

(65) Prior Publication Data

US 2020/0218162 A1 Jul. 9, 2020

(30) Foreign Application Priority Data

Jan. 8, 2019 (JP) .................... 2019-001379

(51) Int. Cl.
*G03F 7/20* (2006.01)
(52) U.S. Cl.
CPC .................. *G03F 7/70641* (2013.01)
(58) Field of Classification Search
CPC ............. G03F 7/70483; G03F 7/70308; G03F 9/7026; G03F 7/70216; G03F 7/70641; G03F 7/70725
See application file for complete search history.

(56) References Cited

U.S. PATENT DOCUMENTS 5,739,899 A * 4/1998 Nishi .................. A61K 38/395
355/53

FOREIGN PATENT DOCUMENTS

JP 2017090778 A 5/2017

* cited by examiner

*Primary Examiner* — Steven Whitesell Gordon
(74) *Attorney, Agent, or Firm* — Rossi, Kimms & McDowell LLP

(57) ABSTRACT

An exposure apparatus includes a projection optical system configured to project a pattern of a mask onto a substrate, a substrate stage configured to hold and move the substrate, and a controller configured to control exposure of the substrate held by the substrate stage, wherein the controller obtains an amount of deviation of an image of the pattern projected onto the substrate with respect to the pattern of the mask based on telecentricity information, which is information on telecentricity for respective image heights of the projection optical system, and height information, which is information on the height of a surface of the substrate, and corrects deviation of the image based on the obtained amount of deviation to expose the substrate.

12 Claims, 5 Drawing Sheets

FIG. 7

| | shift | Mag. | | Skew. Rot | | | | | | |
|---|---|---|---|---|---|---|---|---|---|---|
| K1 dX=K₁ | K2 dY=K₂ | K3 dX=K₃X | K4 dY=K₄Y | K5 dX=K₅Y | K6 dY=K₆X | K7 dX=K₇X² | K8 dY=K₈Y² | K9 dX=K₉XY | K10 dY=K₁₀XY |
| K11 dX=K₁₁Y² | K12 dY=K₁₂X² | K13 dX=K₁₃X³ | K14 dY=K₁₄Y³ | K15 dX=K₁₅X²Y | K16 dY=K₁₆XY² | K17 dX=K₁₇Y² | K18 dY=K₁₈X²Y | K19 dX=K₁₉Y³ | K20 dY=K₂₀X³ |
| K21 dX=K₂₁X⁴ | K22 dY=K₂₂Y⁴ | K23 dX=K₂₃X³Y | K24 dY=K₂₄XY³ | K25 dX=K₂₅X²Y² | K26 dY=K₂₆X²Y² | K27 dX=K₂₇XY³ | K28 dY=K₂₈X³Y | K29 dX=K₂₉Y⁴ | K30 dY=K₃₀X⁴ |

EXPOSURE APPARATUS, METHOD FOR CONTROLLING THE SAME AND ARTICLE MANUFACTURING METHOD

BACKGROUND OF THE INVENTION

Field of the Invention

The present invention relates to an exposure apparatus, a method for controlling the same, and an article manufacturing method.

Description of the Related Art

In an exposure apparatus for transferring a pattern of an original plate (mask or reticle) onto a substrate, various corrections are performed for deformation, distortion, and the like of a shot region of the substrate. These corrections are usually performed independently of control (correction) of the focus position. This is because the projection optical system of the exposure apparatus is telecentric, and magnification factor deviation, rotation deviation, and distortion of the shot region do not change even if the focus position changes. However, the projection optical system of the exposure apparatus is not strictly telecentric, and telecentricity exists due to the influence of aberration in the projection optical system.

Japanese Patent Laid-Open No. 2017-90778 discloses a technique for improving overlay accuracy by correcting a defocus amount produced by telecentricity.

Along with recent miniaturization of patterns and an increase in the number of processes performed for thick film resists, it has become impossible to ignore the influence of image shift, change in projection magnification factor, or distortion according to the defocus amount, which is caused by the fact that the telecentricity is not zero. Therefore, there is a need for correction of image deviation with higher accuracy.

SUMMARY OF THE INVENTION

The present invention provides, for example, a technique that is advantageous for improving the accuracy of image deviation correction.

The present invention in its one aspect provides an exposure apparatus operable to expose a substrate, the apparatus including a projection optical system configured to project a pattern of a mask onto the substrate, a substrate stage configured to hold and move the substrate, and a controller configured to control exposure of the substrate held by the substrate stage, wherein the controller obtains an amount of deviation of an image of the pattern projected onto the substrate with respect to the pattern of the mask based on telecentricity information, which is information on telecentricity for respective image heights of the projection optical system, and height information, which is information on the height of a surface of the substrate, and corrects deviation of the image based on the obtained amount of deviation to expose the substrate.

Further features of the present invention will become apparent from the following description of exemplary embodiments (with reference to the attached drawings).

BRIEF DESCRIPTION OF THE DRAWINGS

FIG. 7 is a diagram illustrating an example of pattern for correcting high-order components in a shot region.

DESCRIPTION OF THE EMBODIMENTS

Figure 1:
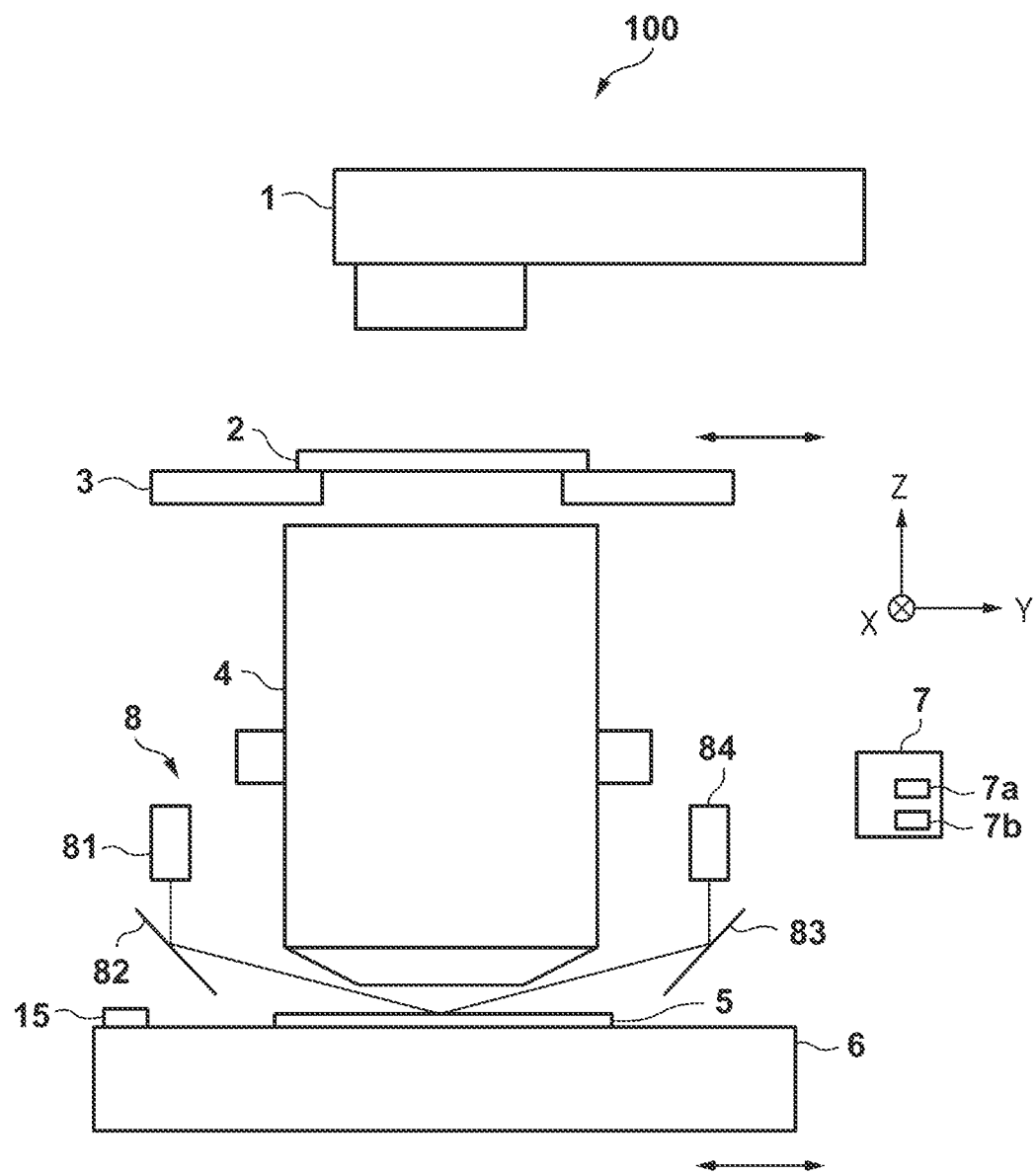
FIG. 1 is a configuration diagram of an exposure apparatus according to an embodiment.

Exemplary embodiments of the present invention will now be described in detail in accordance with the accompanying drawings. The embodiments described here are to be taken as examples only, and are not intended to limit the scope of the patent claim. Although a plurality of features are described in the embodiments, not all of the plurality of features are essential to the present invention, and the plurality of features may be freely combined. Furthermore, in the accompanying drawings, the same reference numerals are assigned to the same or similar components, and a repetitive description thereof is omitted.

FIG. 1 is a diagram illustrating a configuration example of an exposure apparatus 100 according to an embodiment. In this specification, direction is illustrated in an XYZ coordinate system in which the horizontal plane is an XY plane. A substrate 5 is placed on a substrate stage 6 so that its surface is parallel to the horizontal plane (XY plane), and the optical axis of a projection optical system 4 is parallel to a Z axis which is orthogonal to the XY plane.

The exposure apparatus 100 includes an illumination optical system 1, a mask stage 3 for holding and moving a mask 2 as an original, the projection optical system 4, the substrate stage 6 for holding and moving the substrate 5, and a controller 7. The light flux from the illumination optical system 1 passes through the mask 2 held by the mask stage 3 and enters the projection optical system 4. A pattern to be transferred to the substrate 5 is formed on the mask 2. Since the mask 2 and the substrate 5 are in an optically conjugate positional relationship, the pattern of the mask 2 is projected onto the substrate 5 held by the substrate stage 6 via the projection optical system 4, whereby the pattern is transferred onto the substrate 5. The controller 7 includes a CPU 7a, a memory 7b, and the like, and controls the entire exposure apparatus 100. The controller 7 controls the operation of the exposure apparatus 100, that is, an exposure process for exposing the substrate 5 (such as a calculation required for realizing an exposure method in the present embodiment, for example) by comprehensively controlling each unit of the exposure apparatus 100.

The exposure apparatus 100 may include a height measurement device 8 (a focus detection system) for measuring the height of the surface of the substrate. In the height measurement device 8, the light emitted from a light projector 81 is reflected by a mirror 82 and projected onto the substrate 5 from an oblique direction. The light projected onto the substrate 5 is reflected by the substrate surface, and reaches the light receiver 84 via a mirror 83 formed on the opposite side. The light receiver 84 includes a photoelectric converter such as a CCD, and the controller 7 processes a signal obtained by the photoelectric converter to detect a position in the height direction (Z direction) of the surface of the substrate 5.

The position in the optical axis direction of the projection optical system 4 at which an optimal CD (or image quality) is obtained by exposure is defined as the best focus position. The best focus position is adjusted in advance as the origin of the focus detection system, and is information held for each device. In the embodiment, information of the best focus position is stored in the memory 7b of the controller 7. In the exposure apparatus 100, the focal position of the projection optical system 4 may vary due to heat generation by exposure light, variations in atmospheric pressure, environmental temperature, and the like. Therefore, it is necessary to periodically calibrate the best focus position before exposing the substrate. Normally, the influence of the abovementioned variation factors is predicted in advance, and the best focus position is accordingly calibrated, but for more accurate calibration, it is necessary to actually measure the best focus position of the projection optical system and then perform the calibration. The best focus position may be defined, for example, at a position where the substrate stage 6 is sequentially driven in the Z direction to maximize the signal level obtained by the height measurement device 8.

The height measurement device 8 can also be used to obtain the height distribution of the surface of the substrate 5. The height measurement device 8 irradiates measurement light onto the substrate 5, and receives the measurement light reflected by the substrate 5 by the light receiver 84. The measurement light received by the light receiver 84 is photoelectrically converted and sent to the controller 7. The controller 7 performs signal processing on this, and measures the focus position (Z direction position) of the substrate 5. By repeatedly moving the substrate 5 in the X and Y directions, information (height information) on the height of the surface of the substrate 5 is obtained. As explained with reference to FIG. 3, in the embodiment, the resolution of the height of the surface of the substrate included in the height information is higher than the resolution of the focus driving of the substrate stage 6. If a resist is coated on the substrate, it may be necessary to take into account the error of the measurement sensor due to the thickness of the resist.

The exposure apparatus 100 may include a telecentricity measurement device 15 that measures telecentricity for each image height of the projection optical system 4. The chief rays passing through the pupil center being parallel to the optical axis of the optical system is referred to as "the optical system is telecentric". The optical system being telecentric ensures that even if the object defocuses, the image is only blurred and does not become deviated laterally. Although the optical system in the exposure apparatus is designed to be as telecentric as possible, it is extremely difficult to prevent the occurrence of a tilt in the chief rays at respective image heights due to manufacturing error and the like. Hereinafter, tilt in the chief rays of the illumination optical system 1 and the projection optical system 4 will referred to as "telecentricity".

Accurately zeroing telecentricity is difficult in practice, and the telecentricity though slight may remain. In addition, telecentricity is not uniform across image heights, but rather there are different errors for each image height. Therefore, when the substrate is defocused from the best focus position of the projection optical system, the image is displaced (shifted) in a direction orthogonal to the optical axis of the projection optical system in accordance with the defocus amount. As a result, the projection magnification of the image by the projection optical system changes, or the distortion (distortion aberration), which is optical aberration, changes. Here, the shift amount and the projection magnification change linearly with respect to the defocus amount of the substrate with respect to the best focus position, and the distortion changes nonlinearly.

Conventionally, since the defocus amount falls within the depth of focus of the projection optical system, the adverse effect on the imaging characteristics due to the remaining telecentricity has not been so problematic. However, along with recent miniaturization of patterns and an increase in the number of processes performed for thick film resists, it has become impossible to ignore the influence of image shift, change in projection magnification factor, or distortion according to the defocus amount, which is caused by the fact that the telecentricity is not zero. In particular, the influence of the telecentricity due to a thick film resist is large. In an exposure apparatus, the telecentricity can be thought to be about several milliradians to several tens of milliradians numerically. For example, if the defocus amount is 100 nanometers and the telecentricity is 10 milliradians, the image deviation amount is 1 nanometer. A deviation amount of 1 nanometer can be a problem with respect to the need for a high-accuracy overlay due to miniaturization of current semiconductor devices.

Figure 2:
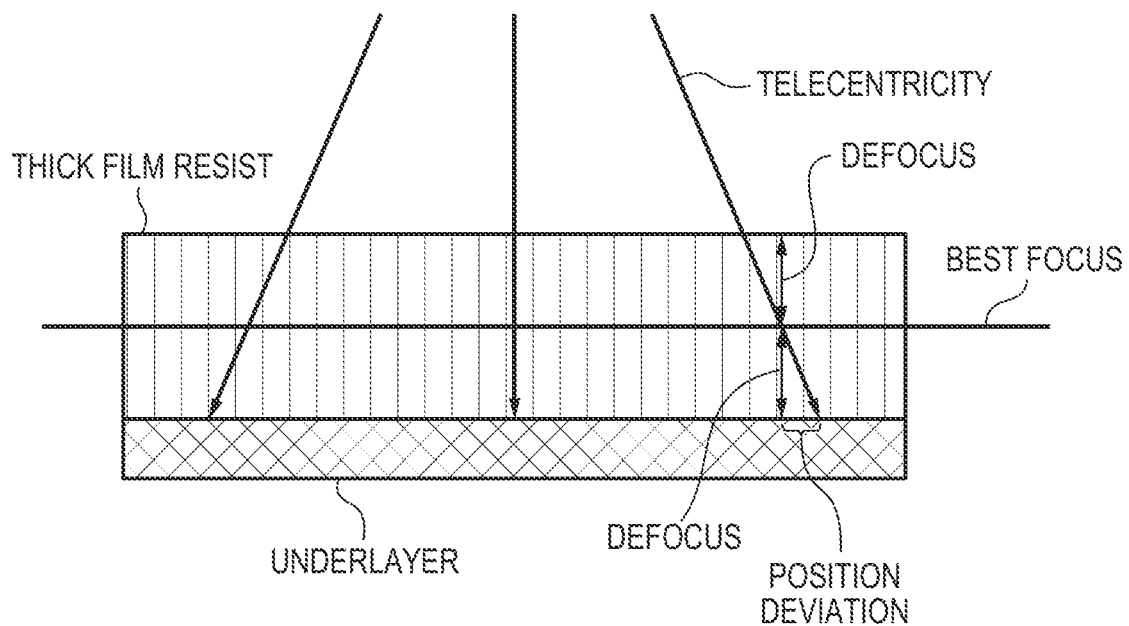
FIG. 2 is a view illustrating an example of position deviation due to defocus caused by a thick film resist.

FIG. 2 is a view illustrating an example of position deviation due to defocus caused by a thick film resist. When the thick film resist is exposed, image deviation (position deviation) occurs due to resist thickness and telecentricity. In the case of a normal resist thickness, the image deviation is very small, which is not a problem. However, thick film resists are expected to be as thick as 10 micrometers, in which case defocus of ±5 micrometers may occur on average. Thus, an image deviation that cannot be ignored may occur according to this defocus amount. Therefore, in the case of using a thick film resist, a countermeasure against the image deviation corresponding to the defocus amount is required.

Figure 3:
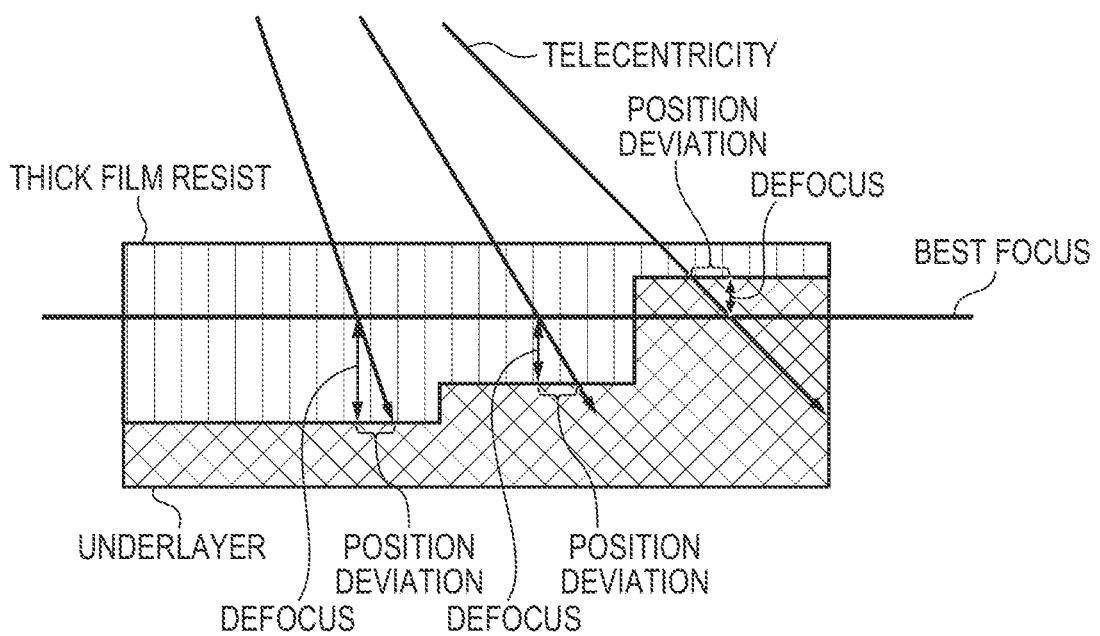
FIG. 3 is a view illustrating an example of position deviation due to defocus caused by a thick film resist and a stepped underlayer.

Further, in a process using the thick film resist, a multi-layered structure is assumed, and as illustrated in FIG. 3, cases in which the underlayer has a stepped shape are also envisioned. Currently, it is difficult to make the best focus position follow such level differences of the underlayer due to a lack of resolution of the focus driving. Therefore, the defocus amount also changes according to the shape of the underlayer, and the influence of the telecentricity changes.

In the embodiment, the controller 7 obtains, based on information related to telecentricity for each image height of the projection optical system (hereinafter referred to as "telecentricity information") and information related to the height of the surface of the substrate (hereinafter referred to as "height information"), a deviation amount of an image (image deviation amount) of the pattern projected onto the substrate with respect to the pattern of the mask. The height information can be obtained from a result of measuring using the height measurement device 8 as described above. Alternatively, the height information may be obtained by inputting external data. Alternatively, the height information may be stored in the memory 7b in advance, and the controller 7 may obtain the height information by reading the height information from the memory 7b. Alternatively, board design information (process design information) may be stored in advance in the memory 7b, and the controller 7 may obtain the height information based on the design information. The telecentricity information can be obtained from the results of telecentricity measurements using the telecentricity measurement device 15. For measurement of the telecentricity, for example, there is a method of measuring the deviation amount at each image height at each of the best focus position and the defocus position, and obtaining the telecentricity from the relationship between the amount of defocus and the deviation amount. Telecentricity can be measured using a sensor, and it is not necessary to form a mark on the substrate beforehand. Alternatively, instead of performing the measurement, the telecentricity information may be obtained by a user inputting the telecentricity information or the like. Alternatively, the telecentricity information may be stored in the memory 7b in advance, and the controller 7 may obtain the telecentricity information by reading it from the memory 7b. Alternatively, design information of the projection optical system 4 may be stored in the memory 7b in advance, and the controller 7 may obtain the telecentricity information based on the design information.

In the embodiment, the controller 7, during processing for exposing a shot region (hereinafter, also referred to simply as "shot") of the substrate 5, the influence of the telecentricity according to the shape of the underlayer is corrected. In the exposure processing, the aberration generated by the thermal deformation and the optical characteristics of the projection optical system 4 is also corrected. The aberration correction can be realized by driving the optical elements of the projection optical system 4, driving an optical element of the illumination optical system 1, adjusting a laser frequency (light source), driving the mask stage 3, driving the substrate stage 6, and the like. The aberration correction can be performed in real time within the shot region even for high-order components. An image deviation caused by telecentricity can also be treated as an aberration. Therefore, the controller 7 performs, for example, at least one of the following so as to reduce the obtained image deviation amount.

(a) Driving the substrate stage 6.
(b) Driving the mask stage 3.
(c) Driving the optical elements of the projection optical system 4.
(d) Driving the optical elements of the illumination optical system 1.
(e) Adjustment of the pulsed oscillation frequency of the light source of the illumination optical system 1.

Figure 4:
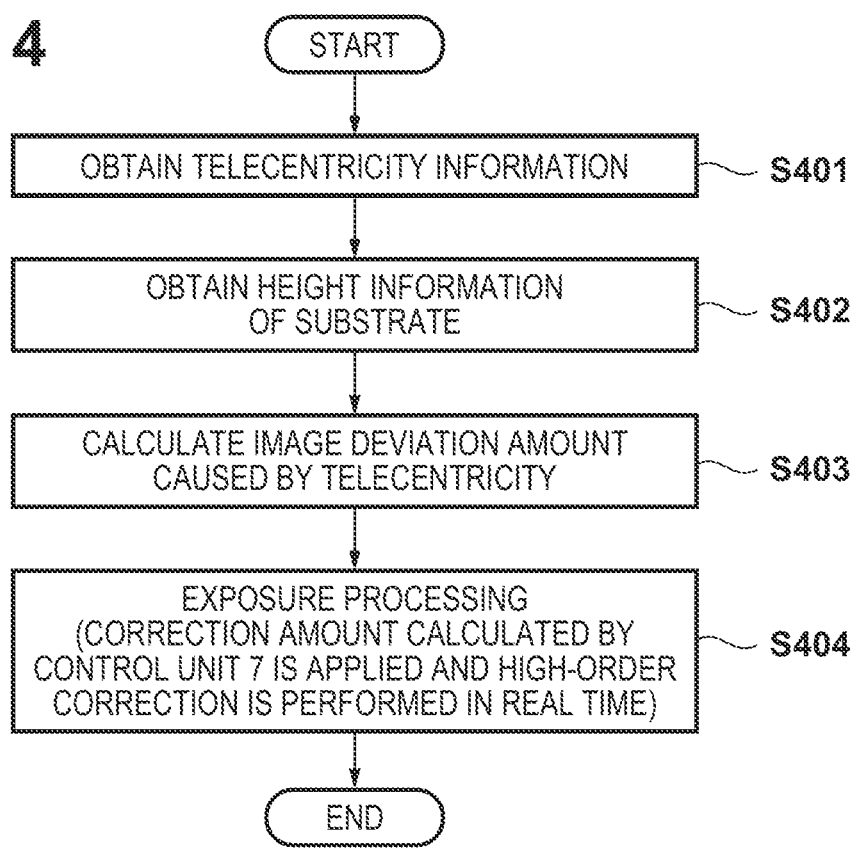
FIG. 4 is a flowchart illustrating a method for controlling the exposure apparatus according to the embodiment.

A flowchart of a control method of the exposure apparatus 100 according to the present embodiment is illustrated in FIG. 4. In step S401, the controller 7 obtains telecentricity information in the manner described above. In step S402, the controller 7 obtains height information. The height information may be obtained in the manner described above. Note that here, the defocus amount may be estimated from the step information on the design of the substrate using the process design information. It is more effective to combine undulation information of the substrate plane according to the detection of position deviation according to oblique light incidence as described above. In the present embodiment, the height of the substrate surface refers to the defocus amount for each image height generated by the shape of the underlayer. Alternatively, the height of the substrate surface may be the difference in height from the best focus plane generated by the shape of the underlayer.

Figure 5:
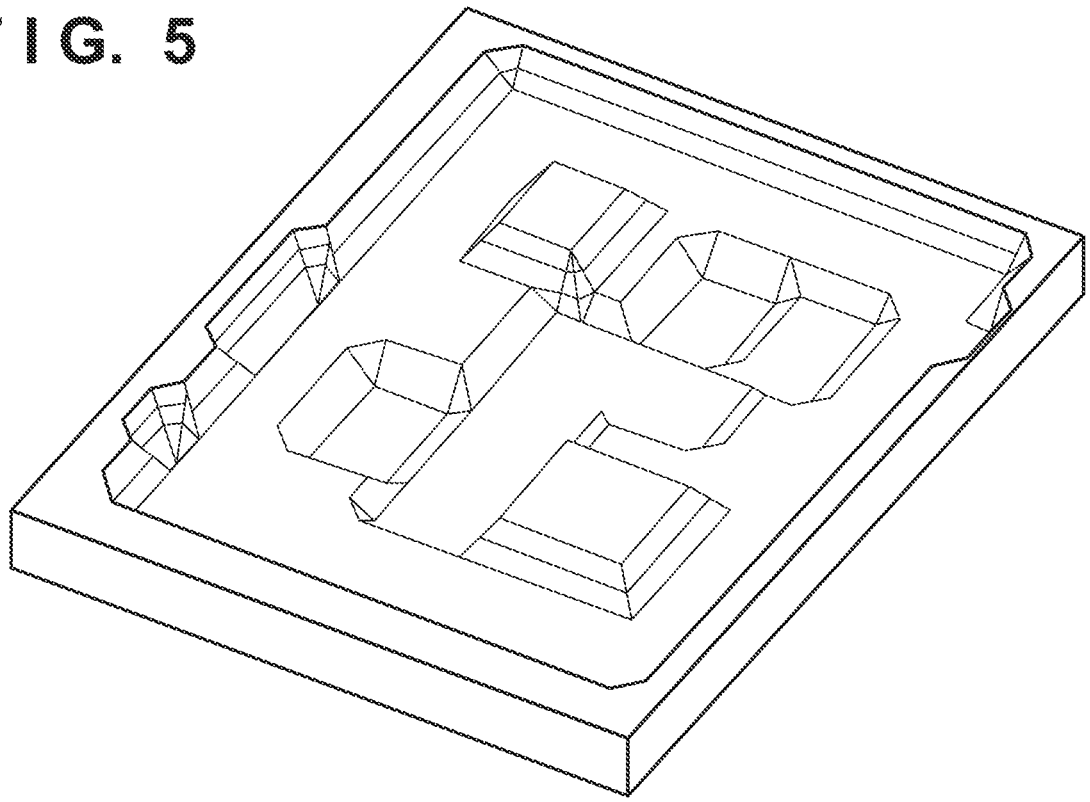
FIG. 5 is a schematic view illustrating a level difference of an underlayer in a shot region.
Figure 6:
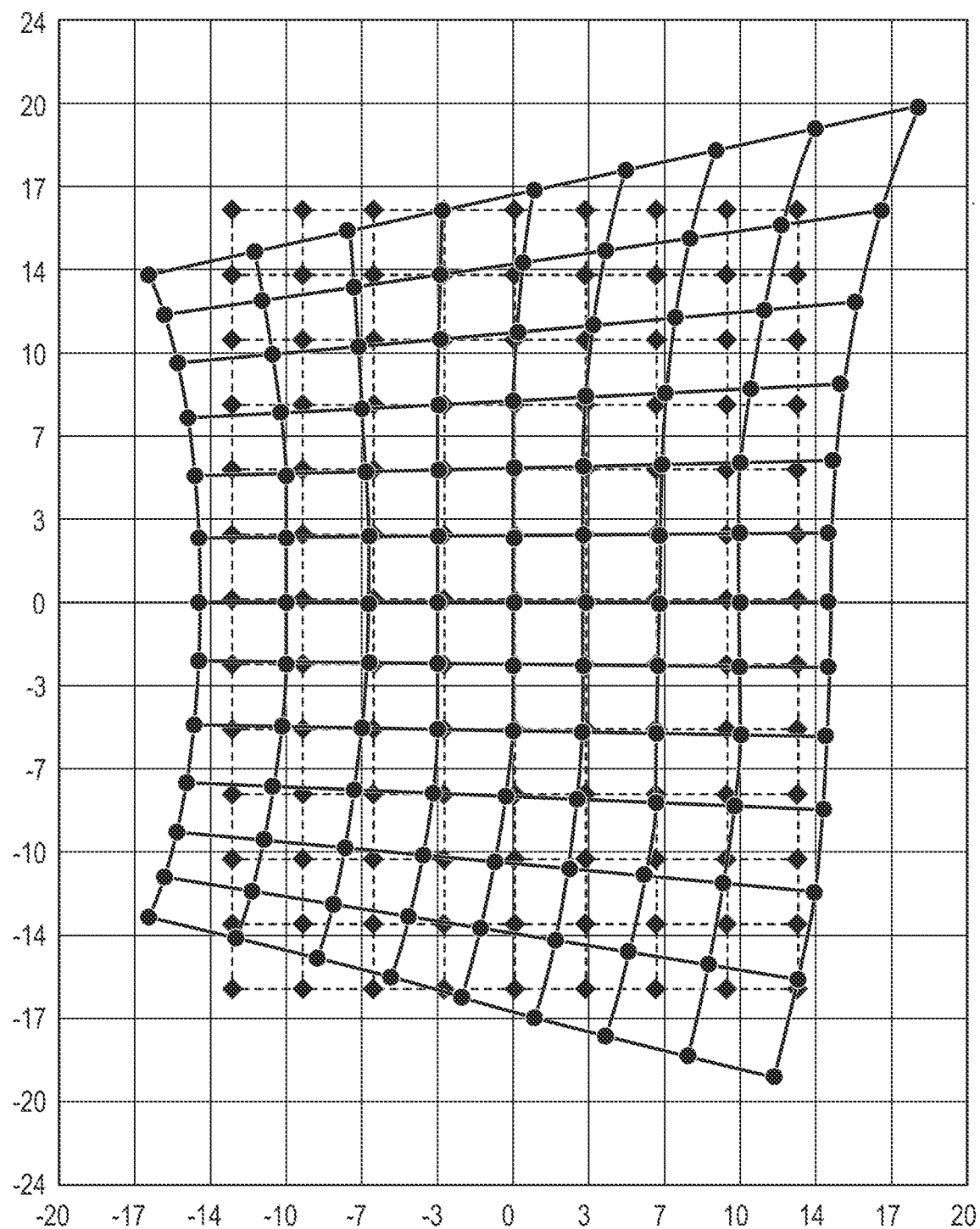
FIG. 6 is a view illustrating an image deviation including a high-order component caused by a step in an underlayer due to telecentricity.

Further, for example, as illustrated in FIG. 5, when there are steps in the underlayer within one shot, image deviation appears as a high-order component including a lateral trapezoidal shape, a vertical trapezoidal shape, and a vertical barrel shape, as illustrated in FIG. 6. In the embodiment, the image deviation due to the steps in the underlayer within one shot can be understood as a high-order component of the aberration, and the image deviation within the shot can be corrected by performing an in-shot high-order correction in real time during the exposure processing. As basic correction patterns for correcting high-order components in a shot, for example, as illustrated in FIG. 7, there are correction patterns of a 0-order shift, magnification factor, and a first-order, second-order, third-order, or fourth-order skew. Correction is performed by appropriately combining these correction patterns. The shift can be corrected by driving the substrate stage and/or the mask stage. The magnification factor, skew, and high-order components can be corrected by driving the optical elements of the optical system. However, these are merely examples. For example, a component of a second order or more, a component of a third order or more, or the like can be used as a high-order component.

In step S403, the controller 7 calculates an image deviation amount generated by the telecentricity. At the time of exposure processing, a mark on the substrate surface is detected by the focus detection system, so that correction is performed in real time, and the stage is driven to a focal position where the imaging performance is within an allowable range, whereby the best focus position is maintained. In step S403, the controller 7 calculates the image deviation amount caused by the telecentricity for each image height by using the following information.

(1) Telecentricity information obtained in step S401 (telecentricity for each image height),
(2) Height information (height distributions (defocus amount) of the substrate surface) obtained in step S402, and
(3) The best focus position held in the memory 7b.

If the height of the surface of the substrate is H, the best focus position is BF, and the defocus amount is DF, then the defocus amount DF is represented by:

$$DF = BF - H$$

When the telecentricity [rad] is θ and the image deviation amount is S, the image deviation amount S is expressed by the following equation:

$$S = DF \cdot \cos \theta$$

The telecentricity defined here is a unit [nm/um] representing a change amount [nm] of the telecentricity at the time of 1 [um] defocusing.

In step S404, the controller 7 corrects the image deviation amounts obtained in step S403 as high-order components in the shot-by-shot processing during the exposure processing. Specifically, the controller 7 performs at least one of driving the substrate stage 6, driving the mask stage 3, driving the projection optical system 4, driving the illumination optical system 1, and adjusting the pulsed oscillation frequency of the light source of the illumination optical system 1 so as to reduce the obtained image deviation amount.

Through the above processing, it is possible to correct the image deviation caused by the telecentricity at the time of exposure based on the height distribution of the underlayer and the telecentricity for each shot.

<Embodiments of an Article Manufacturing Method>

An article manufacturing method according to the embodiment of the present invention is suitable for manufacturing an article such as a microdevice such as a semiconductor device or an element having a microstructure, for example. The article manufacturing method of the present embodiment includes a step of forming a latent image pattern on a photosensitive agent applied to a substrate by using the above-mentioned exposure apparatus (a step of exposing the substrate), and a step of developing the substrate on which the latent image pattern is formed by such a step. In addition, such manufacturing methods include other well-known processes (such as oxidation, deposition, evaporation, doping, planarization, etching, resist stripping, dicing, bonding, and packaging). The article manufacturing method of the present embodiment is advantageous in at least one of performance, quality, productivity, and production cost of an article as compared with a conventional method.

OTHER EMBODIMENTS

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-001379, filed Jan. 8, 2019, which is hereby incorporated by reference herein in its entirety.

What is claimed is:

1. An exposure apparatus operable to expose a substrate, the apparatus comprising:
   a projection optical system configured to project a pattern of a mask onto the substrate;
   a substrate stage configured to hold and move the substrate; and
   a controller configured to control exposure of the substrate held by the substrate stage,
   wherein the controller is configured to:
      obtain telecentricity information, which is information on telecentricity for respective image heights of the projection optical system, and obtain height information, which is information on a height of a pattern formed on the substrate in advance,
      determine a defocus amount from a difference between a best focus position in an optical axis direction of the projection optical system and the height of the pattern formed on the substrate in advance indicated by the obtained height information,
      determine an amount of deviation of an image of the pattern projected onto the substrate with respect to the pattern of the mask based on the determined defocus amount and the telecentricity for respective image heights, and
      correct, during the exposure of the substrate, the deviation of the image for each shot region based on the determined amount of deviation.

2. The exposure apparatus according to claim 1, wherein the amount of deviation is determined by:

$$S = DF \cdot \cos \theta$$

where S denotes the amount of deviation, DF denotes the defocus amount, and $\theta$ denotes the telecentricity.

3. The exposure apparatus according to claim 1, wherein a resolution of the height of the pattern formed on the substrate in advance included in the height information is higher than a resolution of focus driving of the substrate stage.

4. The exposure apparatus according to claim 1, comprising
   a height measurement device for measuring the height of the pattern formed on the substrate,
   wherein the controller is configured to obtain the height information from a result of a measurement using the height measurement device.

5. The exposure apparatus according to claim 1, wherein the controller is configured to obtain the height information based on design information of the substrate.

6. The exposure apparatus according to claim 1, comprising
   a telecentricity measurement device configured to measure a telecentricity for each image height of the projection optical system,
   wherein the controller is configured to obtain the telecentricity information from a result of measurement using the telecentricity measurement device.

7. The exposure apparatus according to claim 1, wherein the controller is configured to obtain the telecentricity information based on design information of the projection optical system.

8. The exposure apparatus according to claim 1, comprising
   a mask stage configured to hold the mask; and
   an illumination optical system configured to illuminate the mask when held by the mask stage,
   wherein the controller is configured to correct the deviation of the image by performing at least one of driving of the substrate stage, driving of the mask stage, driving of an optical element of the projection optical system, driving of an optical element of the illumination optical system, and adjusting a pulsed oscillation frequency of a light source of the illumination optical system so as to reduce the determined amount of deviation during the exposure on a shot region of the substrate.

9. A method of manufacturing an article, comprising
   exposing a substrate using an exposure apparatus according to claim 1;
   developing the exposed substrate; and
   manufacturing the article from the developed substrate.

10. The exposure apparatus according to claim 1, wherein the height information includes information of a level difference of the pattern formed on the substrate in advance.

11. The exposure apparatus according to claim 1, wherein the controller is configured to correct, during the exposure of the substrate, the deviation of the image for each shot region by using the determined amount of deviation as a higher-order component of an aberration of the projection optical system.

12. A method for controlling an exposure apparatus that projects a pattern of a mask onto a substrate through a projection optical system and exposes the substrate, the method comprising:

obtaining telecentricity information, which is information on telecentricity for respective image heights of the projection optical system;

obtaining height information, which is information on a height of a pattern formed on the substrate in advance;

determining a defocus amount from a difference between a best focus position in an optical axis direction of the projection optical system and the height of the pattern formed on the substrate in advance indicated by the obtained height information;

determining an amount of deviation of an image of the pattern projected onto the substrate with respect to the pattern of the mask based on the determined defocus amount and the telecentricity for respective image heights; and correcting, during the exposure of the substrate, the deviation of the image for each shot region based on the determined amount of deviation.

\* \* \* \* \*